United States Patent
Misra et al.

(10) Patent No.: US 6,873,020 B2
(45) Date of Patent: Mar. 29, 2005

(54) HIGH/LOW WORK FUNCTION METAL ALLOYS FOR INTEGRATED CIRCUIT ELECTRODES

(75) Inventors: Veena Misra, Raleigh, NC (US); Huicai Zhong, Raleigh, NC (US); ShinNam Hong, Seoul (KR)

(73) Assignee: North Carolina State University, Raleigh, NC (US)

( * ) Notice: Subject to any disclaimer, the term of this patent is extended or adjusted under 35 U.S.C. 154(b) by 148 days.

(21) Appl. No.: 10/081,861

(22) Filed: Feb. 22, 2002

(65) Prior Publication Data

US 2003/0160227 A1 Aug. 28, 2003

(51) Int. Cl.⁷ .............................................. H01L 29/45

(52) U.S. Cl. .................... 257/407; 257/412; 257/768

(58) Field of Search ................................. 257/407, 412, 257/768

(56) References Cited

U.S. PATENT DOCUMENTS

| | | | | |
|---|---|---|---|---|
| 3,591,838 A | * | 7/1971 | Fujiwara et al. | 257/742 |
| 6,010,584 A | | 1/2000 | Fonda et al. | 148/563 |
| 6,166,417 A | * | 12/2000 | Bai et al. | 257/407 |
| 6,376,888 B1 | * | 4/2002 | Tsunashima et al. | 257/407 |
| 6,458,695 B1 | * | 10/2002 | Lin et al. | 438/659 |
| 6,518,106 B2 | * | 2/2003 | Ngai et al. | 438/157 |
| 6,653,698 B2 | * | 11/2003 | Lee et al. | 257/407 |

OTHER PUBLICATIONS

IBM TDB vol.31 No.3 Aug. 1988 pp 46–47 "Method for producing . . . Electrodes".*
Ishii et al., *Work Function of Binary Alloys*, Appl. Suf. Sci., vol. 169–170, Jan. 2001, pp. 658–661.
Misra et al., *Use of Metal–Oxide–Semiconductor Capacitors to Detect Interactions of Hf and Zr Gate Electrodes with $SiO_2$ and $ZrO_2$*, Applied Physics Letters, Jun. 25, 2001, pp. 4166–4168.
Zhong et al., *Properties of Ru–Ta Alloys as Gate Electrodes for NMOS and PMOS Silicon Devices*, 2001 IEEE Electron Devices Meeting, IEDM Technical Digest International, Dec. 2001, pp. 20.5.1 –20.5.4.
Wuu et al, *Material characteristics and thermal stability of cosputtered Ta–Ru thin films*, J. Vac. Sci. Technol. A, vol. 17, No. 6, 1999, pp. 3327–3332.

* cited by examiner

*Primary Examiner*—Jerome Jackson
(74) *Attorney, Agent, or Firm*—Myers Bigel Sibley & Sajovec

(57) ABSTRACT

Integrated circuit electrodes include an alloy of a first metal and a second metal having lower work function than the first metal. The second metal also may have higher oxygen affinity than the first metal. The first metal may be Ru, Ir, Os, Re and alloys thereof, and the second metal may be Ta, Nb, Al, Hf, Zr, La and alloys thereof. Both NMOS and the PMOS devices can include gate electrodes of an alloy of the first metal and the second metal having lower work function than the first metal. The PMOS gate electrode may have a higher percentage of the first metal relative to the second metal than the NMOS gate electrode. Thus, a common material system may be used for gate electrodes for both NMOS and PMOS devices.

12 Claims, 11 Drawing Sheets

HIGH/LOW WORK FUNCTION METAL ALLOYS FOR INTEGRATED CIRCUIT ELECTRODES

FEDERALLY SPONSORED RESEARCH

This invention was made with Government support under National Science Foundation Contract No. ECS: 0074800. The Government may have certain rights to this invention.

FIELD OF THE INVENTION

This invention relates to integrated circuit devices and fabrication methods, and more particularly to integrated circuit electrodes, such as gate electrodes for integrated circuit field effect transistors, and fabrication methods therefor.

BACKGROUND OF THE INVENTION

Integrated circuit devices are widely used in consumer and commercial applications. As the integration density of integrated circuit devices continues to increase, it may be desirable to scale down features of integrated circuits such as electrode structures. As is well known to those having skill in the art, electrode structures may be used in integrated circuits for plate electrodes of a capacitor, for gate electrodes of a field effect transistor and/or for other uses.

For example, as silicon-based integrated circuit field effect transistors are scaled to below about 100 nm, it may be desirable to use dielectrics having high dielectric constants to obtain an equivalent oxide thickness below about 1 nm. Unfortunately, as equivalent oxide thickness continues to decrease, it may be undesirable to use polysilicon gate electrodes that are commonly used for integrated circuit field effect transistors, due, for example, to gate depletion and/or other potential problems.

It is also known that integrated circuit field effect transistors often are provided in complementary n-channel and p-channel devices. These n-channel devices often are referred to as NMOS devices and the p-channel devices often are referred to as PMOS devices. When supplied together on an integrated circuit, NMOS and PMOS devices are referred to as complementary MOS devices, or CMOS devices. It is known that it may be desirable for the work function of gate electrodes for NMOS devices to be about 4 eV, and for PMOS devices to be about 5 eV. Moreover, for processing purposes, it may be desirable to provide gate electrodes that can provide high thermal stability, so as to reduce or minimize undesirable changes under high temperature annealing.

SUMMARY OF THE INVENTION

Integrated circuit electrodes according to some embodiments of the invention comprise an alloy comprising a first metal and a second metal having lower work function than the first metal. In other embodiments, the second metal also has higher oxygen affinity than the first metal. In some embodiments, the first metal has a work function that is greater than about 4.5 eV and the second metal has a work function that is less than about 4.5 eV. In still other embodiments, the first metal is selected from the group consisting of Co, Ni, Pd, Rh, Ru, Ir, Pt, Au, Re, Os, $RuO_2$, $IrO_2$ and alloys thereof, and the second metal is selected from the group consisting of Mn, Mg, V, Ti, Cr, Y, Zr, Ta, La, Gd, Sm, Pr, Nb, Al, Hf and alloys thereof.

It has been found, according to some embodiments of the invention, that integrated circuit electrodes having desirable properties can be obtained by using an alloy of a relatively high work function metal and a relatively low work function metal in an electrode. The work function can be tailored to a desirable level, while still retaining desirable thermal stability. These electrodes also can provide an oxygen barrier which can reduce or prevent external oxygen diffusion, according to some embodiments of the invention.

In some embodiments of the present invention, the first metal has a work function of about 5 eV and the second metal has a work function of about 4 eV. In other embodiments of the present invention, the first metal has a work function of between about 5 eV and about 5.2 eV, and the second metal has a work function of between about 4 eV and about 4.1 eV. In still other embodiments of the invention, the first metal has a work function of between about 5 eV and 5.2 eV and the second metal has a work function of between about 3.5 eV and about 4.0 eV.

In still other embodiments of the invention, the integrated circuit electrode is a first gate electrode for a first integrated circuit field effect transistor that includes first spaced apart source and drain regions in an integrated circuit substrate and a first gate insulating region on the integrated circuit substrate between the first spaced apart source and drain regions, wherein the first gate electrode is on the first gate insulating region opposite the integrate circuit substrate. In other embodiments, a second gate insulating region and a second gate electrode may be provided between the spaced apart source and drain regions, to provide a multiple gate integrated circuit field effect transistor. Moreover, in other embodiments, the first integrated circuit field effect transistor may be combined with a second integrated circuit field effect transistor of opposite conductivity type that includes second spaced apart source and drain regions in the integrated circuit substrate that have opposite conductivity type from the first spaced apart source and drain regions, a second gate insulating region on the integrated circuit substrate between the second spaced apart source and drain regions, and a second gate electrode on the second gate insulating region opposite the integrated circuit substrate. In some embodiments, the second gate electrode comprises the first metal. In other embodiments, the second gate electrode is free of the second metal. In still other embodiments, the second gate electrode comprises an alloy comprising the first metal and the second metal. In still other embodiments, the second gate electrode comprises an alloy comprising the first metal and the second metal and having different amounts of the first metal relative to the second metal than the first gate electrode.

Other embodiments of the invention can provide gate electrodes for both NMOS and PMOS field effect transistors in a CMOS device. In particular, in some embodiments, both the NMOS and the PMOS devices include gate electrodes comprising an alloy comprising the first metal and the second metal having lower work function than the first metal. In some embodiments, the PMOS gate electrode has a higher percentage of the first metal relative to the second metal than the NMOS gate electrode. In other embodiments, the NMOS gate electrode comprises an Ru/Ta alloy having between about 40% Ta and about 54% Ta, and the PMOS gate electrode comprises an Ru/Ta alloy having less than about 20% Ta. In still other embodiments, the NMOS gate electrode comprises an Ru/Ta alloy having at least about 30% Ta and the PMOS gate electrode comprises an Ru/Ta alloy having less than about 30% Ta. Thus, according to some embodiments of the present invention, a common material system may be used for gate electrodes for both NMOS and PMOS devices.

Integrated circuit electrodes may be fabricated according to some embodiments of the present invention by coforming an alloy comprising a first metal and second metal having lower work function than the first metal on an integrated circuit substrate. Various embodiments of gate electrodes for field effect transistors and CMOS devices may be provided as were described in detail above.

According to other embodiments, the alloy is coformed by cosputtering an alloy comprising a first metal and a second metal having lower work function than the first metal on an integrated circuit substrate. Moreover, in still other embodiments, the gate electrodes for the NMOS and PMOS transistors may be formed by cosputtering, at different sputtering power, from a first sputtering target that includes the first metal and a second sputtering target that includes the second metal.

DETAILED DESCRIPTION OF PREFERRED EMBODIMENTS

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the figures and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions may be exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present. Moreover, each embodiment described and illustrated herein includes its complementary conductivity type embodiment as well.

Figure 1:
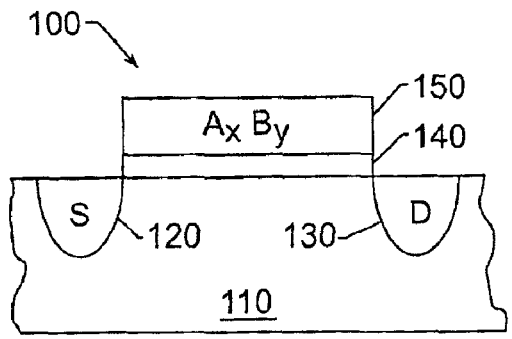
FIG. 1 is a cross-sectional view of integrated circuit field effect transistors including integrated circuit electrodes according to some embodiments of the present invention.

Referring now to FIG. 1, a cross-sectional view of an integrated circuit field effect transistor including an integrated circuit electrode according to some embodiments of the present invention is shown. As shown in FIG. 1, the integrated circuit field effect transistor 100 includes an integrated circuit substrate 110, spaced apart source and drain regions 120 and 130, respectively, in the integrated circuit substrate, and a gate insulating region 140 on the integrated circuit substrate 110 between the spaced apart source and drain regions 120 and 130. As will be understood by those having skill in the art, the substrate may comprise silicon (monocrystalline, polycrystalline and/or amorphous) and/or other semiconductor materials and/or may comprise a multilayer substrate including, for example, a thin silicon layer on a substrate that is separated from the substrate by a buried insulating layer in what is commonly known as semiconductor-on-insulator (SOI) technology and/or one or more epitaxial layers on a base substrate. The design, fabrication and operation of integrated circuit field effect transistors as described in this paragraph are well known to those having skill in the art, including many design and fabrication alternatives for the integrated circuit substrate 110, source region 120, drain region 130, and gate insulating region 140, and need not be described further herein.

Still referring to FIG. 1, according to some embodiments of the invention, the integrated circuit field effect transistor 100 also includes a gate electrode 150 that comprises an alloy, shown in FIG. 1 as $A_xB_y$, of a first metal A and a second metal B having lower work function than the first metal. Although FIG. 1 illustrates a binary alloy $A_xB_y$, a ternary or higher alloy also may be employed in other embodiments of the invention. Moreover, in still other embodiments, the second metal B also has a higher oxygen affinity than the first metal A. In yet other embodiments of the invention, the first metal A has a work function that is greater than about 4.5 eV and the second metal B has a work function that is less than about 4.5 eV. In still other embodiments of the invention, the first metal A is selected from the group consisting of Co, Ni, Pd, Rh, Ru, Ir, Pt, Au, Re, Os, $RuO_2$, $IrO_2$ and alloys thereof, and the second metal B is selected from the group consisting of Mn, Mg, V, Ti, Cr, Y, Zr, Ta, La, Gd, Sm, Pr, Nb, Al, Hf and alloys thereof. In yet other embodiments, the first metal is Ru and the second metal is Ta. In still other embodiments, the first and second metals may both be selected from the group consisting of Co, Ni, Pd, Rh, Ru, Ir, Pt, Au, Re, Os, $RuO_2$, $IrO_2$ and alloys thereof, or from the group consisting of Mn, Mg, V, Ti, Cr, Y, Zr, Ta, La, Gd, Sm, Pr, Nb, Al, Hf and alloys thereof, as long as a work function difference is present. For example, alloys of Zr and Ta may be used in some embodiments.

Moreover, in some embodiments, the first metal A has a work function of about 5 eV and the second metal B has a work function of about 4 eV. In still other embodiments of the invention, the first metal has a work function of between about 5 eV and 5.2 eV and the second metal has a work function of between about 3.5 eV and about 4.0 eV. In other embodiments, the first metal has a work function of between about 5 eV and about 5.2 eV, and the second metal has a work function of about 4 eV and about 4.1 eV.

Finally, still referring to FIG. 1, a multiple gate field effect transistor may be provided by providing a second insulating region between the spaced apart source and drain regions 120 and 130, respectively, and a second gate electrode that may comprise a first metal and a second metal having lower work function than the first metal, on the second insulating region. The second gate electrode may be identical to the first gate electrode 150, or may be different therefrom. In some embodiments of multiple gate field effect transistors, the second gate electrode may be formed on the same surface of the integrated circuit substrate 110 as the gate electrode 150. In other embodiments of multiple gate field effect transistors, the second gate electrode may be formed on the face of the integrated circuit substrate 110 that is opposite the first gate, to provide front and back gates.

Figure 2:
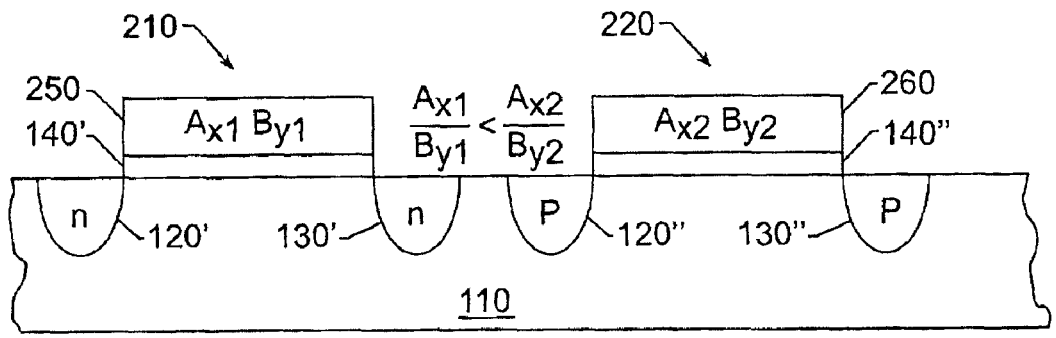
FIG. 2 is a cross-sectional view of CMOS field effect transistors including integrated circuit electrodes according to some embodiments of the present invention.

FIG. 2 is a cross-sectional view of complementary field effect transistors, often referred to as CMOS devices, according to some embodiments of the invention. As shown in FIG. 2, an NMOS device 210, also referred to as an n-channel device, and a PMOS device 220, also referred to as a p-channel device 220, are shown in an integrated circuit substrate 110. The NMOS device 210 includes first spaced apart n-type source and drain regions 120' and 130', respectively, and a first gate insulating region 140' therebetween. The PMOS device 220 includes second spaced apart p-type source and drain regions 120" and 130", respectively, and a second gate insulating region 140" therebetween. Enhancement mode and/or depletion mode NMOS and PMOS devices 210 and 220 respectively may be provided according to embodiments of the invention. The design and fabrication of CMOS devices as described in this paragraph are well known to those having skill in the art, including many design and fabrication alternatives, and need not be described further herein.

Still continuing with the description of FIG. 2, the NMOS device 210 includes a first gate electrode that comprises an alloy, shown in FIG. 2 as $A_{x1}B_{y1}$, comprising a first metal A and second metal B having lower work function than the first metal. In some embodiments, the second gate electrode 260 of the PMOS device 220 also may comprise an alloy, shown as $A_{x2}B_{y2}$, comprising the first metal A and the second metal B. In some embodiments, the relative proportions of the first and second metals are the same, i.e., x1=x2 and y1=y2. In other embodiments, however, the relative proportions of the first and second metals are unequal. Stated differently, in some embodiments the second electrode 260 comprises an alloy comprising the first metal A and the second metal B having different amounts of the first metal relative to the second metal than the first gate electrode 250 for the NMOS device. In other embodiments, the second gate electrode 260 for the PMOS device comprises a higher percentage of the first metal A relative to the second metal B than the first gate electrode 250 for the NMOS device. Thus, as shown in FIG. 2, in some embodiments, $$\frac{A_{x1}}{B_{y1}} < \frac{A_{x2}}{B_{y2}}.$$

For example, in some embodiments, the first gate electrode comprises an Ru/Ta alloy having between about 40% Ta and about 54% Ta, and second gate electrode 260 comprises an Ru/Ta alloy having less than about 20% Ta. In yet other embodiments, the first gate electrode 250 comprises an Ru/Ta alloy having at least about 30% Ta and the second gate electrode 260 comprises an Ru/Ta alloy having less than about 30% Ta.

Finally, still referring to FIG. 2, in yet other embodiments of the invention, the second gate electrode 260 comprises the first metal A, but is free of the second metal B. Thus, referring to FIG. 2, y2 may be 0, so that the second electrode 260 may comprise the first metal A but is free of the second metal B. In other embodiments, the second electrode 260 can consist of the first metal B. In yet other embodiments, the second electrode 260 can consist essentially of the first metal B.

Figure 3:
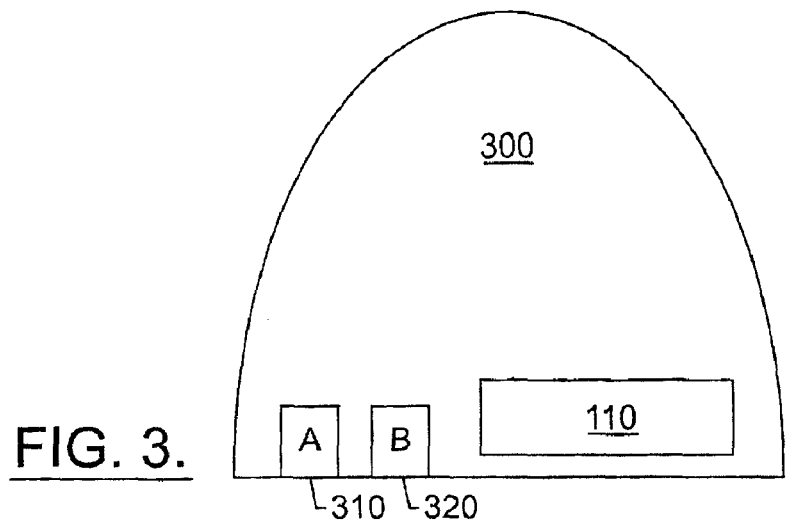
FIG. 3 is a schematic cross-sectional view of systems and methods for fabricating integrated circuit electrodes according to some embodiments of the present invention.

Referring now to FIG. 3, a schematic cross-sectional view of systems and methods of fabricating integrated circuit electrodes according to embodiments of the invention is illustrated. More particularly, integrated circuit electrodes may be fabricated according to some embodiments of the present invention by coforming an alloy comprising a first metal and a second metal having lower work function than the first metal on an integrated circuit substrate. According to other embodiments, and as illustrated in FIG. 3, the coforming comprises cosputtering an alloy comprising the first metal and the second metal having lower work function than the first metal on an integrated circuit substrate. More specifically, as shown in FIG. 3, a sputtering chamber 300 may be used to cosputter an alloy comprising the first metal A and second metal B having lower work function than the first metal on an integrated circuit substrate 110 from a first sputtering target 310 that includes the first metal and a second sputtering target 320 that includes the second metal. Sputtering is well known to those having skill in the art, and need not be described in detail herein. Moreover, other methods for forming integrated circuit electrodes according to embodiments of the invention, such as deposition, may be used.

According to some embodiments of the present invention, when forming a first gate electrode 250 for an NMOS device 210 and a second gate electrode 260 for a PMOS device 220 of FIG. 2, the cosputtering to form the first gate electrode 250 and the second gate electrode 260 may both employ the first and second sputtering targets 310 and 320 of FIG. 3. However, different percentages of the first metal A relative to the second metal B may be obtained by varying the sputtering power in the sputtering chamber 300, using conventional techniques.

Additional discussion of various embodiments of the present invention now will be provided. This discussion is based at least in part on a publication by the present inventors et al., entitled *Properties of Ru—Ta Alloys as Gate Electrodes for NMOS and PMOS Silicon Devices,* 2001 IEEE Electron Devices Meeting, IEDM Technical Digest International, December 2001, pp. 20.5.1–20.5.4, the disclosure of which is hereby incorporated herein by reference in its entirety as if set forth fully herein.

In particular, some characteristics of binary metallic alloys of Ta and Ru for gate electrode applications now will be described. The work function of this alloy can be varied from 4.2 eV to 5.2 eV, according to some embodiments of the invention, by controlling its composition, thereby enabling its use in both NMOS and PMOS devices according to some embodiments of the invention. Excellent thermal stability up to 1000° C. was observed in alloy compositions suitable for both NMOS and PMOS devices according to some embodiments of the invention. Without wishing to be bound by any theory of operation, it appears that the $Ru_1Ta_1$ phase of the film and formation of Ru—Ta bonds can improve the thermal stability of the gate-dielectric (insulating region) interface while maintaining appropriate work functions.

In particular, as gate oxide thickness of conventional field effect transistors decreases, the capacitance associated with the depleted layer at the conventional polysilicon/gate dielectric interface may become significant, making it desirable to consider alternative gate electrodes. Metal gates should have compatible work functions, $\phi_m$ (for example, about 4.1 eV for NMOS and about 5.0 eV for PMOS), process compatibility and/or thermal/chemical interface stability with the underlying dielectric. Several PMOS candidates may have emerged, including the metals Ru, Ir and Pt which have high work function and may be relatively stable at high temperatures due to their low electronegativity. These low electronegativity materials also may not react with a dielectric. On the other hand, metals with NMOS compatible work functions (Zr, Hf, Ti, Ta, etc) typically suffer from thermal instability owing, for example, to their high affinity for metal oxide formation. See Misra et al., *The Use of Metal-Oxide-Semiconductor Capacitors to Detect Interactions of Hf and Zr Gate Electrodes with $SiO_2$ and $ZrO_2$,* Applied Physics Letters, Jun. 25, 2001, pp. 4166–4168. Attempts to modify the low work function metals by adding nitrogen (e.g., TaN) may improve the thermal stability to some extent but at the potential cost of nitrogen diffusion and a slightly larger work function.

According to some embodiments of the invention, binary alloys of Ru and Ta may be used for CMOS gate electrodes. Ru—Ta alloys may be excellent NMOS gate electrode candidates, according to some embodiments of the invention, since they can exhibit low work functions and can demonstrate superior thermal stability compared to Ta. Moreover, by increasing the Ru concentration of this alloy, according to some embodiments of the invention, excellent PMOS gate characteristics may be achieved. According to some embodiments of the invention, a common material system for both NMOS and PMOS devices may be provided that can be stable up to 1000° C.

EXAMPLES

The following Examples shall be regarded as merely illustrative and shall not be construed as limiting the invention. In order to simulate the characteristics of an integrated circuit field effect transistor, metal-oxide-silicon (MOS) capacitors were used. A MOS capacitor fabrication process is summarized in Table 1.

TABLE 1

Isolation (Fox = 3500 Å)
$SiO_2$ (3–10 nm) or $ZrO_2$ formation
$Ru_xTa_y$ deposition (1000 Å)
Ta and Ru sputtering power varied for 11 conditions
Electrode patterning by lift off
Annealing at 400° C. for 30 min
Rapid Thermal Annealing (RTA): 800° C., 900° C. - 30 s & 1000° C. - 10 sec $Ru_xTa_y$ films were cosputtered on thermally grown $SiO_2$ and Physical Vapor Deposited (PVD) $ZrO_2$ from Ru (purity of 99.95%) and Ta (purity of 99.95%) targets in a system with a base pressure of about $3\times10^{-9}$ Torr. The sputtering power of Ta and Ru was varied (between about 0 W and about 100 W) to change the composition. See Table 2.

TABLE 2

| Sample Number | Ta Sputtering Power | Ru Sputtering Power |
| --- | --- | --- |
| 1 | 100 W | 10 W |
| 2 | 100 W | 25 W |
| 3 | 100 W | 50 W |
| 4 | 100 W | 75 W |
| 5 | 100 W | 100 W |
| 6 | 10 W | 100 W |
| 7 | 25 W | 100 W |
| 8 | 50 W | 100 W |
| 9 | 75 W | 100 W |
| 10 | 100 W | 0 W |
| 11 | 0 W | 100 W |

The $Ru_xTa_y$ gate electrodes were patterned using lift-off. All samples were annealed in 10% $H_2/N_2$ at 400° C. for 30 min. The samples were then rapid thermal annealed in Ar at 800° C., 900° C. for 30 sec and at 1000° C. for 10 sec. Capacitance-Voltage (C-V) and Current-Voltage (I-V) characteristics were obtained using HP4284 and HP4155B, respectively, although other conventional systems may be used. The Flat Band Voltage (VFB) and Equivalent Oxide Thickness (EOT) for the capacitors were obtained using a C-V program that is available at North Carolina State University as described in the above-cited Hauser et al. publication, although other conventional C-V programs also may be used.

Figure 4:
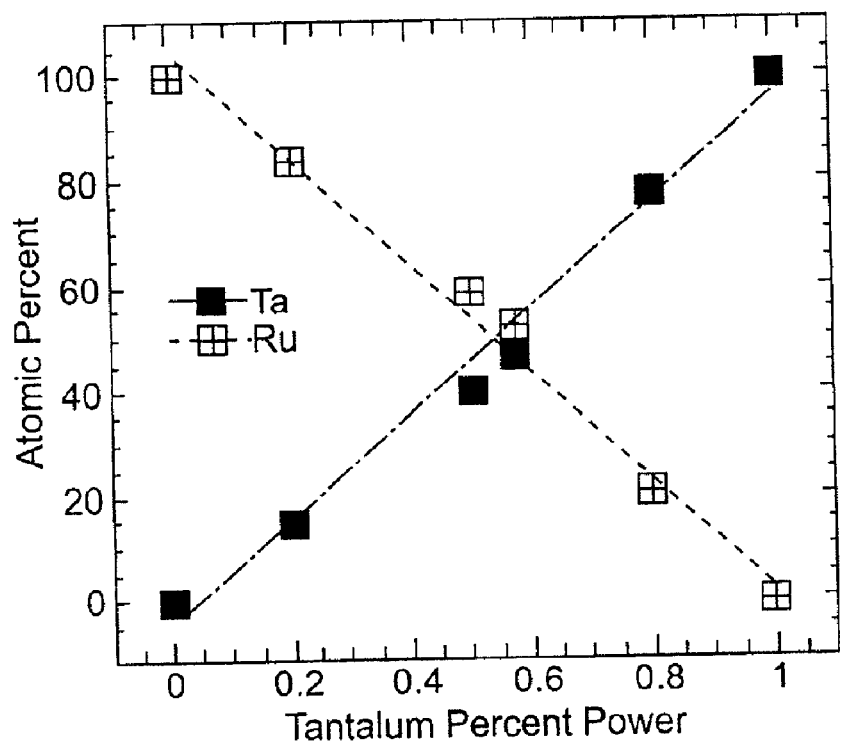
FIG. 4 graphically illustrates composition by auger electron spectroscopy of Ru—Ta alloys as a function of Ta percent power, according to some embodiments of the present invention.
Figure 5:
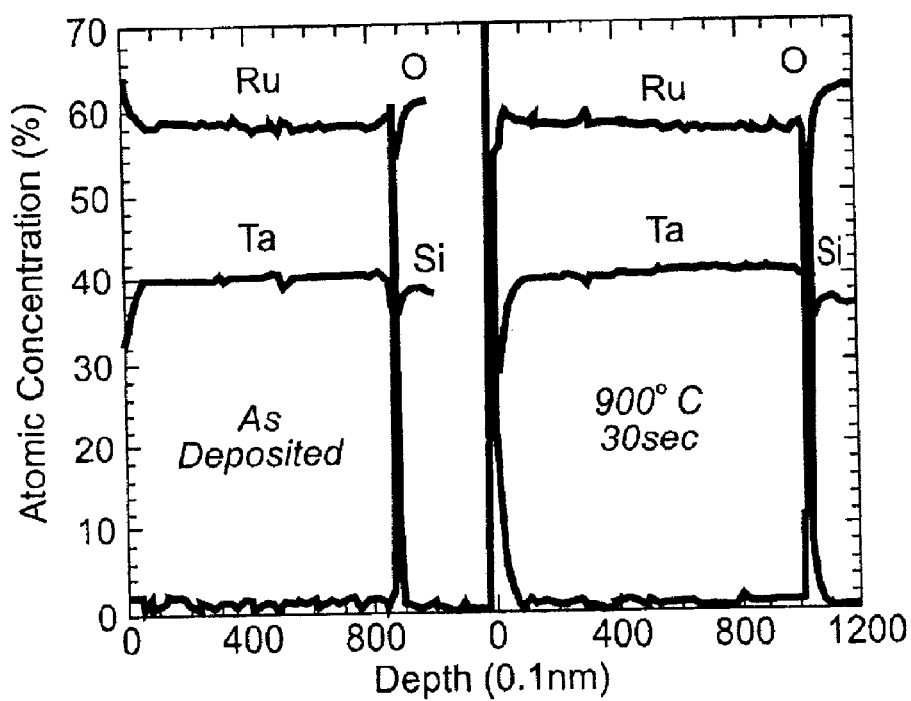
FIG. 5 graphically illustrates a depth profile of Ru—Ta alloy before and after a 900° C. anneal showing uniform stoichiometry and abrupt interfaces, according to some embodiments of the present invention.
Figure 6:
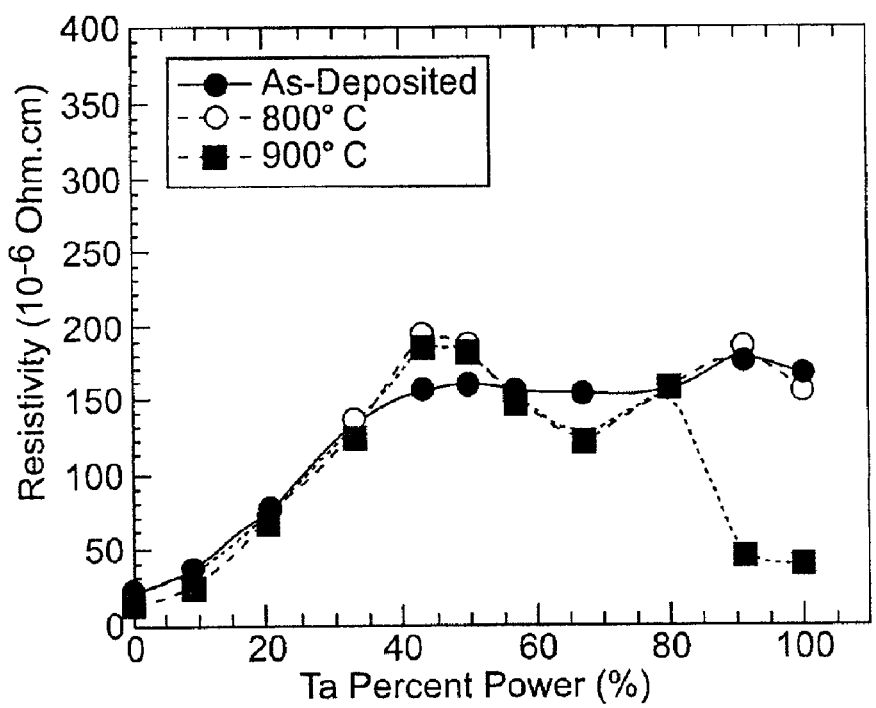
FIG. 6 graphically illustrates resistivity as a function of Ta percent power for as deposited, 800° C. annealed and 900° C. annealed Ru—Ta alloys, according to some embodiments of the present invention.

As shown in FIG. 4, the Ru and Ta content in the layers obtained by depth profiling Auger exhibits a linear correlation to the sputtering power. Oxygen content for all layers was less than 1%. The depth profile in FIG. 5 indicates that the layer is uniform in composition both before and after high temperature annealing. The resistivity of the Ru—Ta alloy indicates low values for all sputtering conditions and temperatures as shown in FIG. 6. The reported equilibrium phases of the binary Ru—Ta alloy system are summarized in Table 3.

TABLE 3

| Atomic Percent Ta | Phase Description (From Binary Alloy Phase Diagrams, 1990) |
|---|---|
| 0–20% | Single Phase (Ru) |
| 20–37% | Mixed phase (Ru + γ) |
| 37–40% | Single Phase (γ) |
| 40–43% | Mixed Phase $Ru_1Ta_1$ + γ) |
| 43–60% | $Ru_1Ta_1$ |
| 60–68% | mixed phase ($Ru_1Ta_1$ + Ta) |
| 68–100% | Single Phase (Ta |

When the atomic percent (at. %) Ta is less than about 20%, a (Ru) phase is obtained and when it is more than about 70% a (Ta) phase is obtained. A single phase of Ru—Ta alloy is obtained when the at. % Ta concentration is between about 40% and about 60%. Mixed phases are observed under other conditions.

The resulting phase may impact the electronic properties of the material such as work function and thermal stability. Therefore, for layers with at. % Ta less than about 20%, Ru-like properties may be expected such as a large work function and excellent thermal stability film. Similarly, layers with at. % Ta more than about 70% may be expected to exhibit Ta-like properties. However, when the at. % Ta concentration is between about 40% and about 60%, a new single phase is obtained, according to some embodiments of the invention, whose electronic properties are described below.

Figure 7:
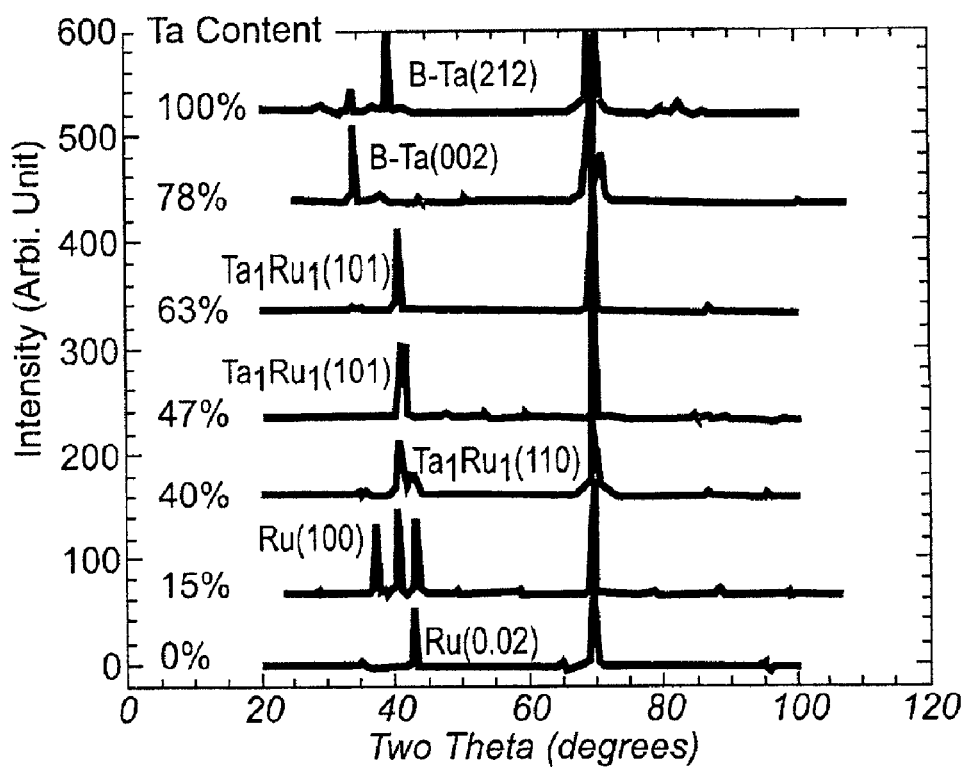
FIG. 7 graphically illustrates X-ray diffraction peaks of Ru—Ta alloys annealed at 900° C. rapid thermal annealing in argon, according to some embodiments of the present invention.

The X-Ray Diffraction (XRD) analysis is shown in FIG. 7 on layers annealed at 900° C. by RTA. The β-Ta phase in pure Ta layers diminished with increasing Ru content and $Ru_1Ta_1$ became dominant in alloys with at. % Ta content of about 40%, about 47% and about 62%. Further increase in Ru content resulted in the formation of Ru (002) phase, which is dominant in the pure Ru sample. The XRD data agrees with the equilibrium phases in Table 3.

Figure 8:
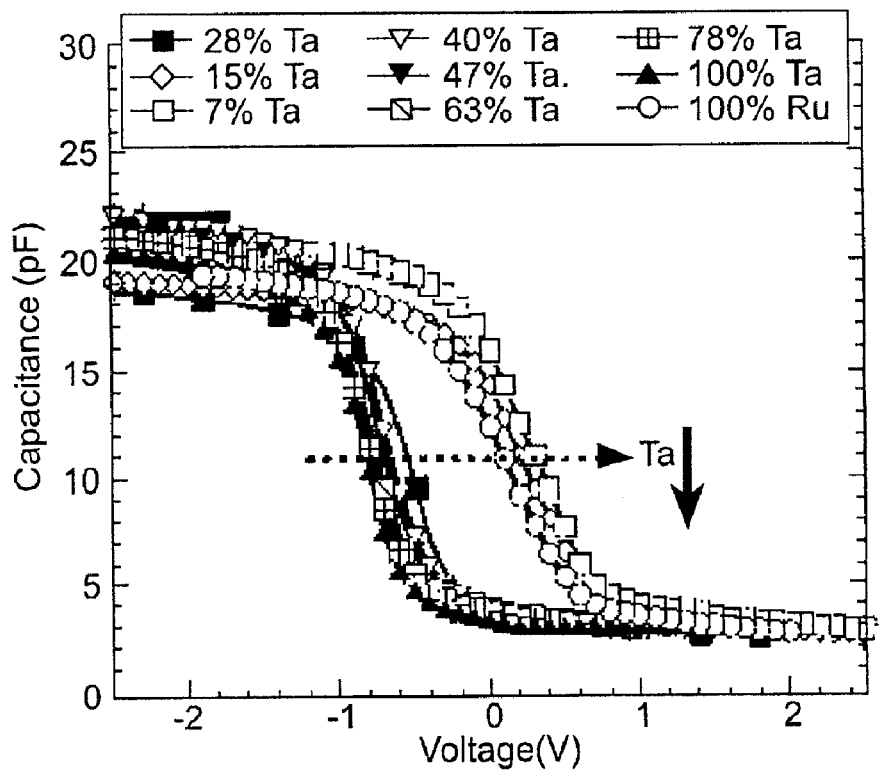
FIG. 8 graphically illustrates capacitance-voltage curves of Ru—Ta alloy gates on $SiO_2$/p-type Si after annealing at 400° C. for 30 minutes, according to some embodiments of the present invention.
Figure 9:
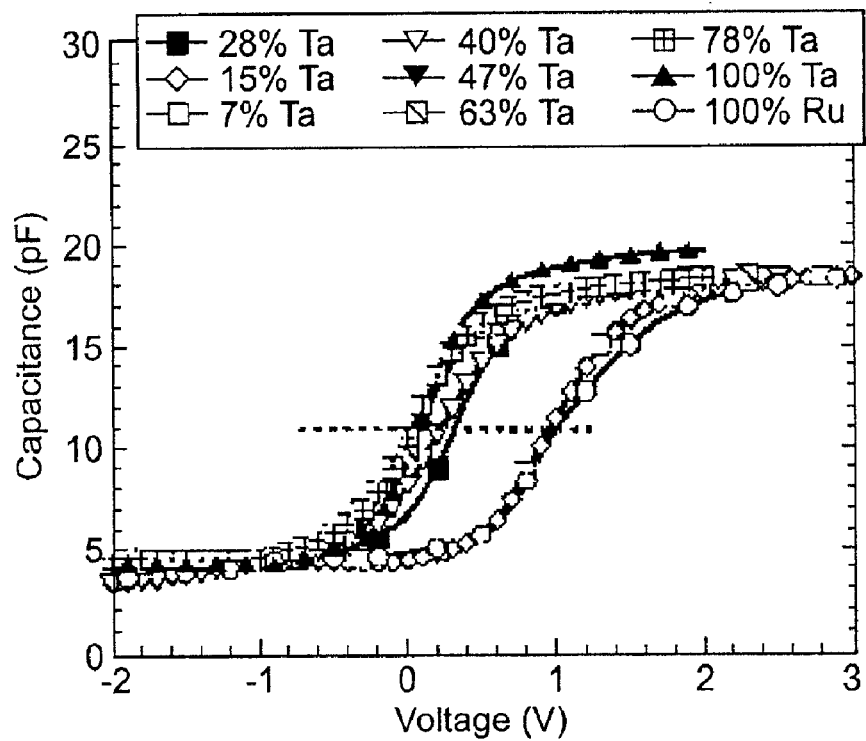
FIG. 9 graphically illustrates capacitance-voltage curves of Ru—Ta alloy gates on $SiO_2$/n-type Si after annealing at 400° C. for 30 minutes, according to other embodiments of the present invention.
Figure 10:
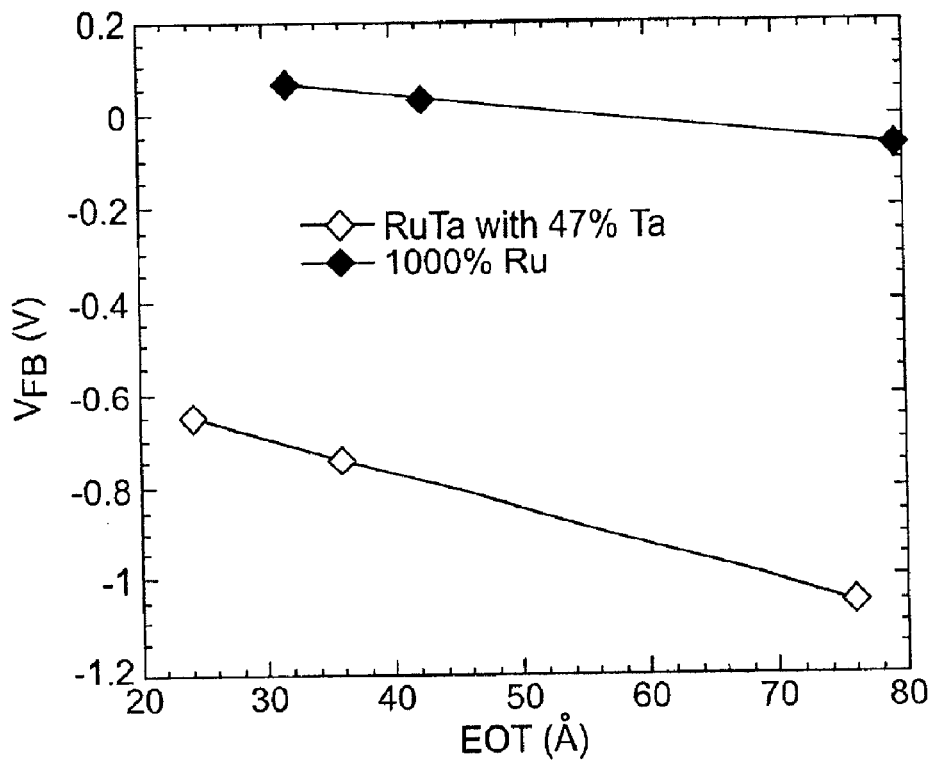
FIG. 10 graphically illustrates flat band voltage vs. equivalent oxide thickness for two Ru—Ta alloy compositions, according to some embodiments of the present invention.
Figure 11:
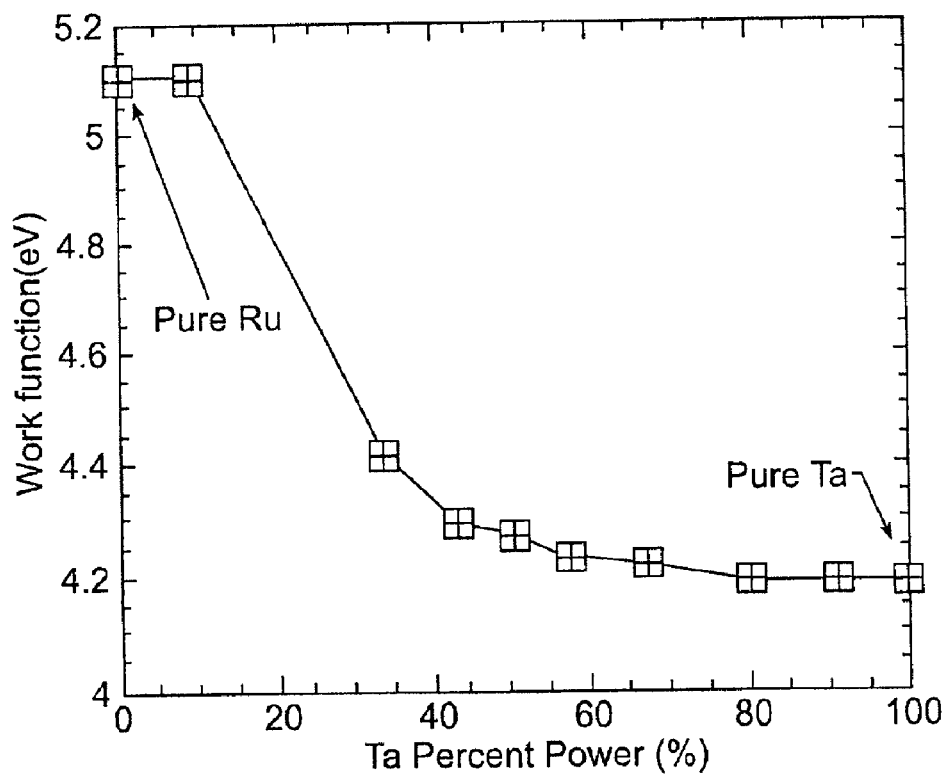
FIG. 11 graphically illustrates work function extracted from capacitance-voltage curves for various compositions of Ru—Ta alloys, according to some embodiments of the present invention.
Figure 12:
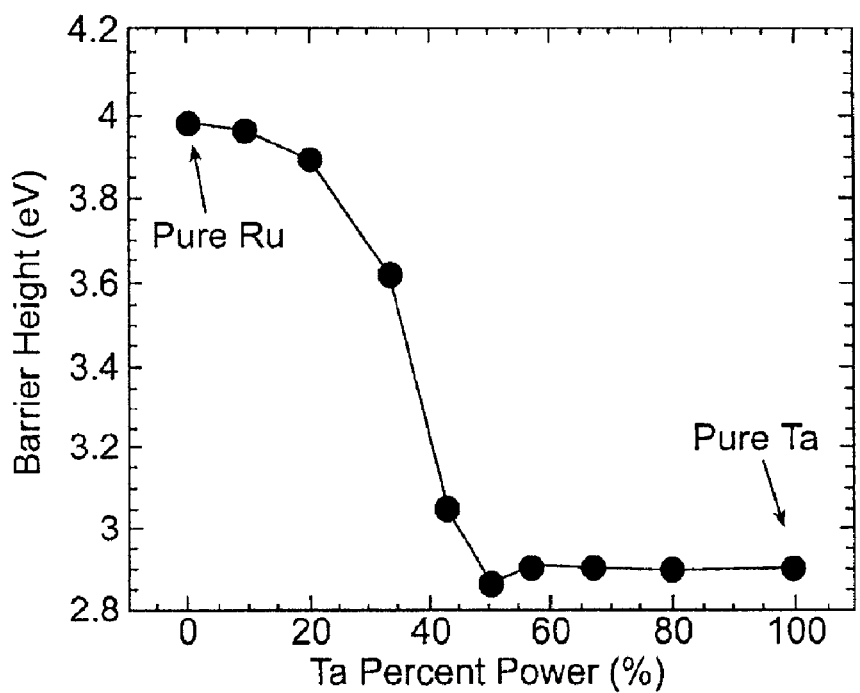
FIG. 12 graphically illustrates barrier height extraction using Fowler-Nordheim analysis, according to some embodiments of the present invention.

The C-V curves of the capacitors with $Ru_xTa_y$ gate electrodes after annealing at 400° C. are shown in FIG. 8 and FIG. 9 for n-type and p-type substrates, respectively. In order to decouple the effect of fixed charge from the work function, C-V measurements on several oxide thicknesses were used to generate a VFB vs. EOT curve. The y-intercept of this curve indicated the work function, $\phi_m$, as shown in FIG. 10. The extracted $\phi_m$ values for all the $Ru_xTa_y$ alloys with varying Ta contents range from about 4.2–5.2 eV as shown in FIG. 11. This suggests that $Ru_xTa_y$ films have work functions that may be appropriate for both NMOS and PMOS devices, according to some embodiments of the invention. This work function trend was also confirmed by barrier height extrapolation using Fowler-Nordheim analysis as a function of Ta content (FIG. 12). As shown in both FIGS. 11 and 12, non-linear behavior of the work function of $Ru_xTa_y$ as a function of content is observed which agrees with published work on Ag—Au and Pt—Rh alloys. See Ishii et al., *Work Function of Binary Alloys*, Appl. Suf. Sci., Volume 169–170, January 2001, pp. 658–661.

Figure 13:
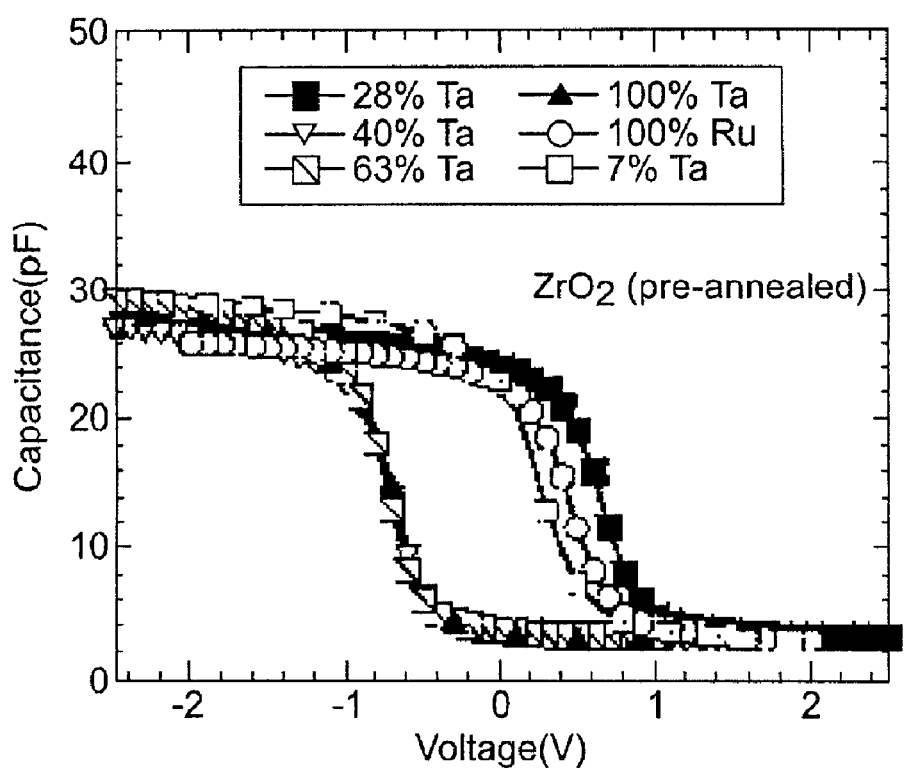
FIG. 13 graphically illustrates capacitance-voltage curves of Ru—Ta alloy gate $ZrO_2$/p-type Si after post-gate annealing at 4 for 30 minutes, according to some embodiments of the present invention.
Figure 14:
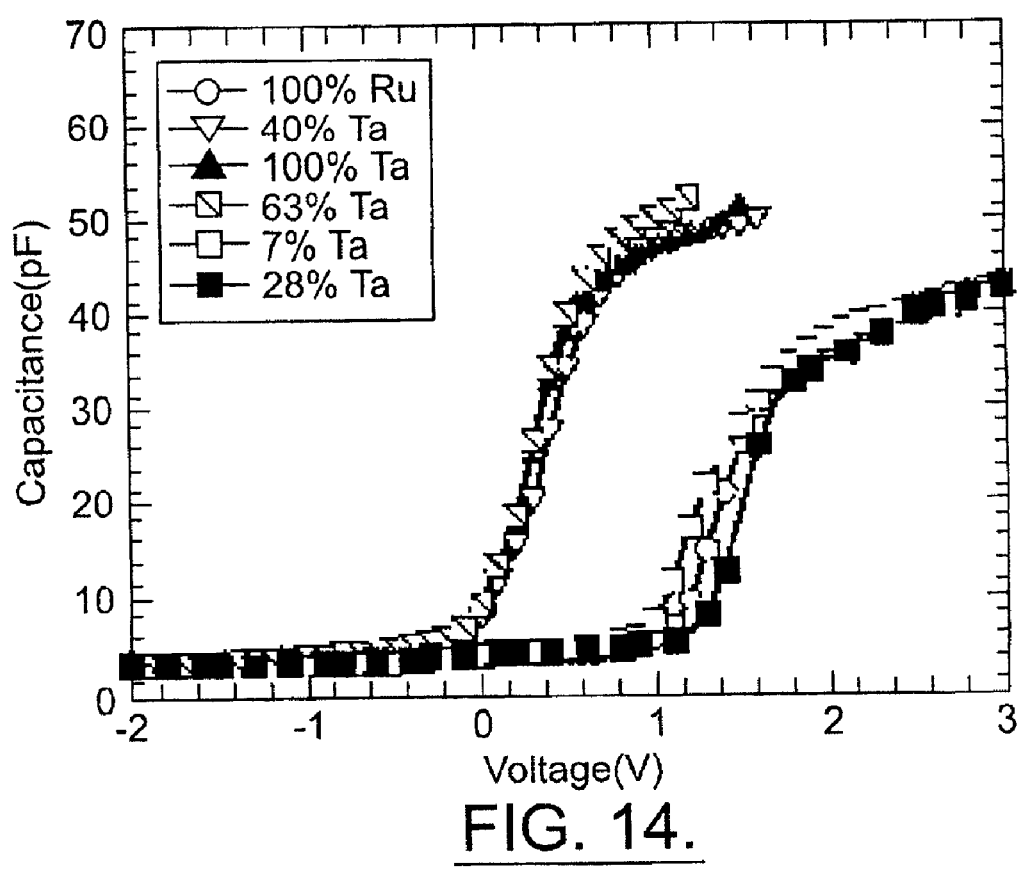
FIG. 14 graphically illustrates capacitance-voltage curves of Ru—Ta alloy gates on $ZrO_2$/p-type Si after post-gate annealing at 400° C. for 30 minutes, according to other embodiments of the present invention.

It should be noted that although all layers with Ta content exceeding about 35% resulted in a low work function in these Examples, only the layers with Ta content between about 40% and about 64% exhibited a single Ru—Ta phase in these embodiments. Other layers are either Ta phases or mixed phases (See Table 3). $Ru_xTa_y$ gates on $ZrO_2$ dielectric regions on n- and p-substrates also displayed appropriate VFB voltages (FIGS. 13 and 14).

Figure 15:
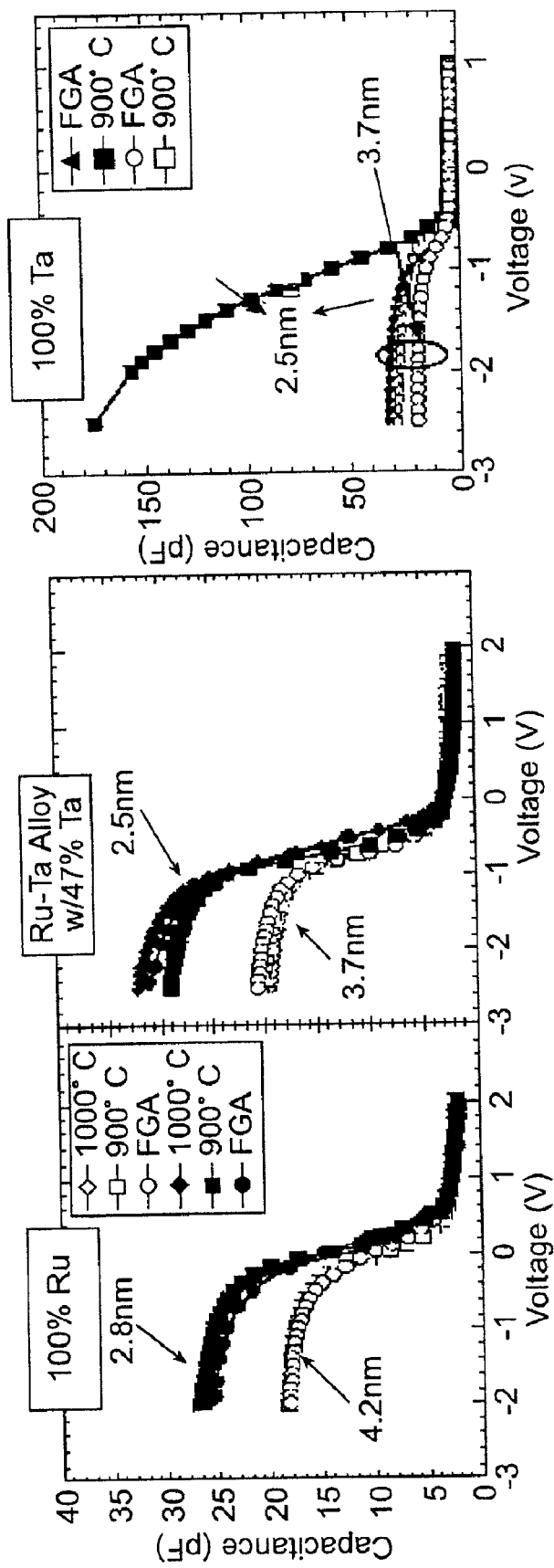
FIG. 15 graphically illustrates capacitance-voltage curves before and after 900° C. and 1000° C. annealing for Ru—Ta alloy, Ru and Ta gates, according to some embodiments of the present invention.
Figure 16:
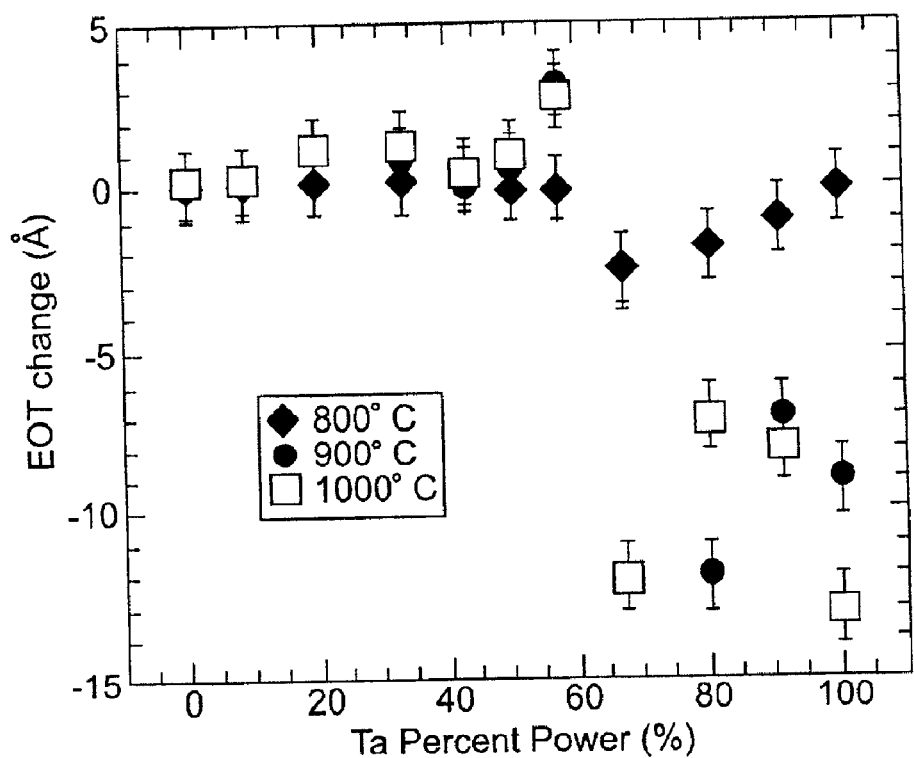
FIG. 16 graphically illustrates equivalent oxide thickness change for Ru—Ta alloys with various Ta percent power, according to some embodiments of the present invention.

Thermal stability was evaluated by annealing MOS capacitors in Ar at 800° C. and 900° C. for 30 sec and at 1000° C. for 10 sec. As shown in FIG. 15, Ta-rich films on $SiO_2$ show degraded characteristics. In contrast, $Ru_xTa_y$ films with at. % Ta of about 47% demonstrated excellent thermal stability similar to that of pure Ru films. The thermal stability for all the alloy compositions is summarized in FIG. 16 where the change in EOT is plotted as a function of anneal temperature. For Ta concentrations that are higher than about 65%, a negative change in EOT is observed and may be attributed to consumption of the $SiO_2$ from top interface reaction (formation of $Ta_2O_5$). On the other hand, layers with at. % Ta of less than about 54% appear to display excellent thermal stability.

Figure 17:
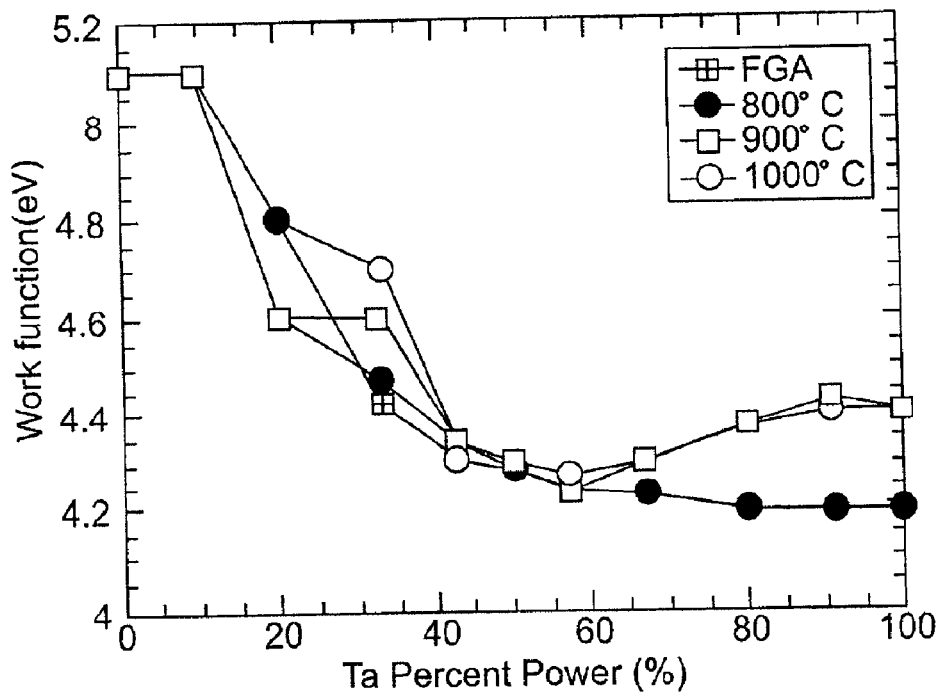
FIG. 17 graphically illustrates work function extracted from capacitance-voltage curves vs. Ta percent power annealed at 800° C., 900° C. and 1000° C., according to some embodiments of the present invention.
Figure 18:
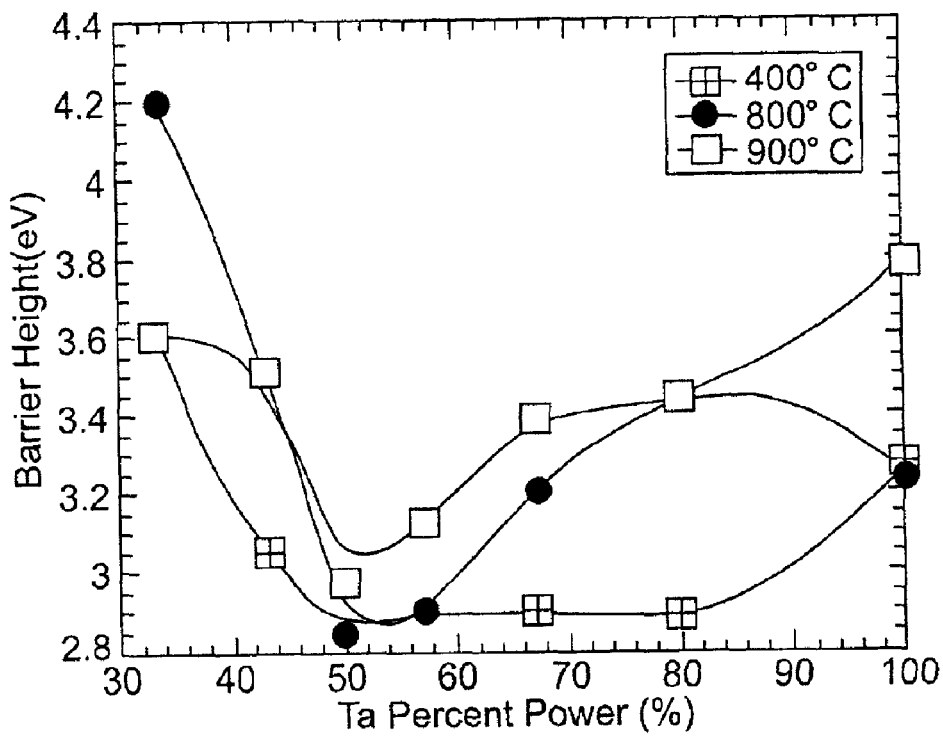
FIG. 18 graphically illustrates barrier height extrapolated from Fowler-Nordheim analysis for annealed Ru—Ta alloys, according to some embodiments of the present invention.

Furthermore, as shown in FIG. 17, films with Ta concentrations of more than about 60% also exhibited a work function change (as extracted using VFB vs. EOT) under high temperature anneals. This change was also confirmed by barrier height measurements (FIG. 18). This change was attributed to the formation of $TaSi_2$ at the top interface. No such change was observed for Ta less than about 60% and layers with at. % Ta of less than about 54% displayed excellent thermal stability. Since layers with at. % Ta between about 40% and about 54% were also found to have low work functions, they appear to be excellent candidates for NMOS devices, according to some embodiments of the invention.

Figure 19:
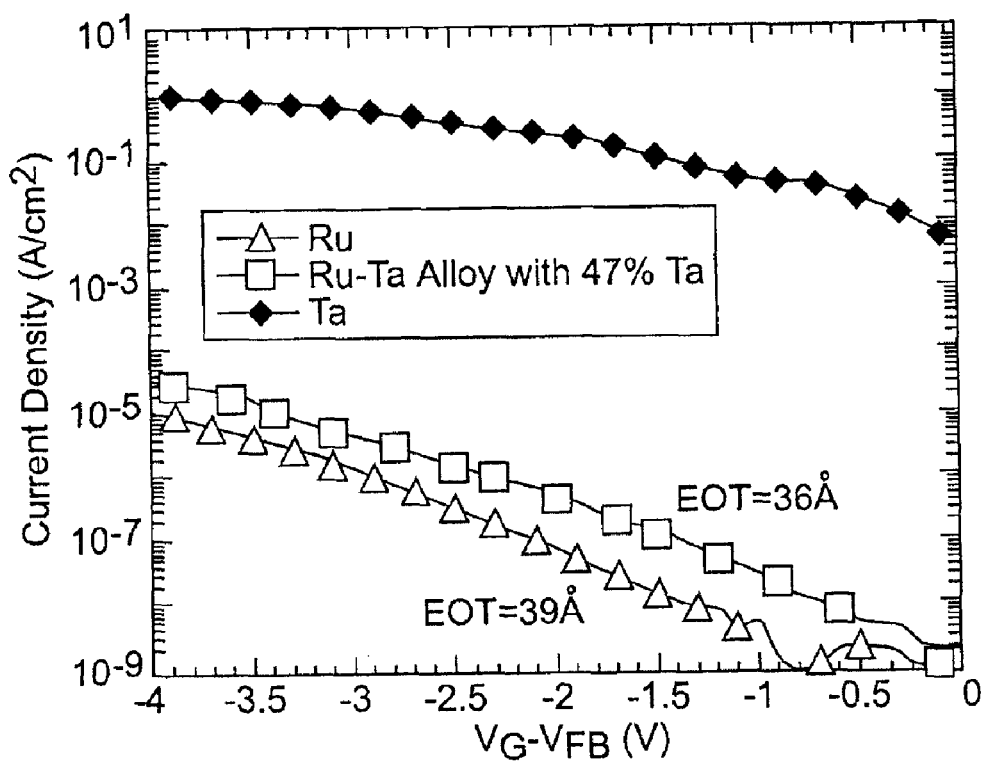
FIG. 19 graphically illustrates gate leakage current of Ru, Ru—Ta alloy and Ta on $SiO_2$ after a 1000° C. anneal, according to some embodiments of the present invention.
Figure 20:
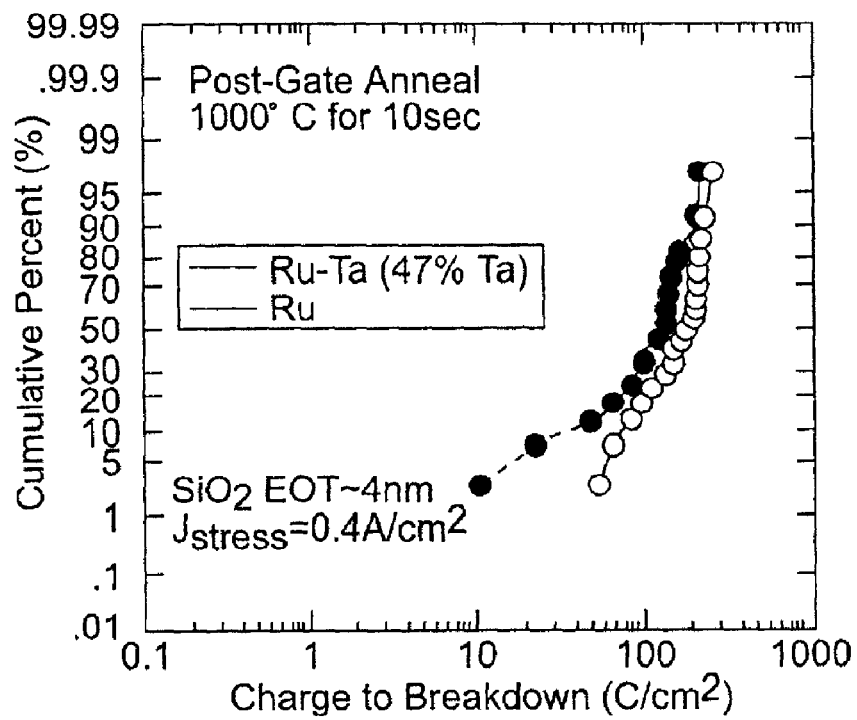
FIG. 20 graphically illustrates constant current charge to breakdown for about 4 nm $SiO_2$ on n-Si under accumulation, according to some embodiments of the present invention.
Figure 21:
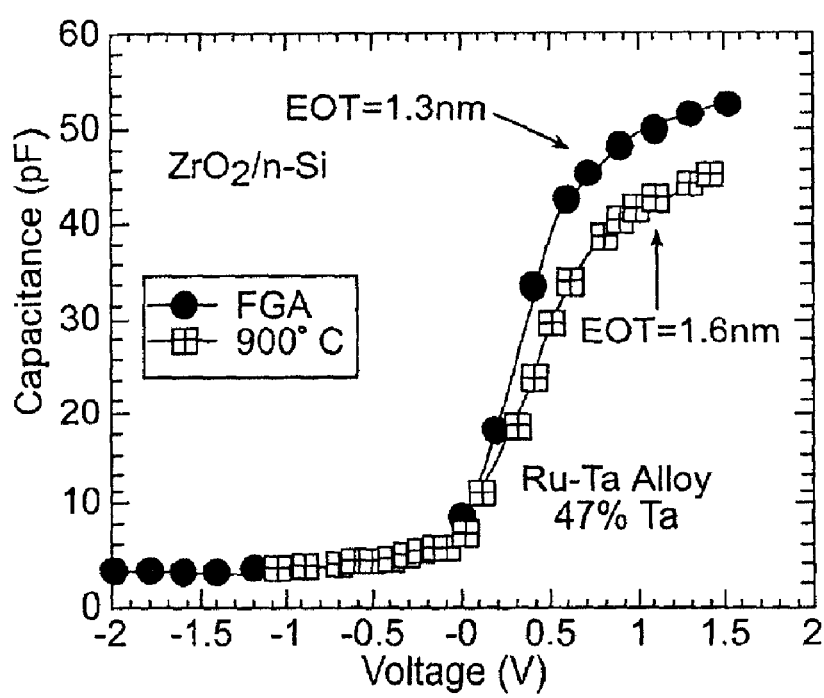
FIG. 21 graphically illustrates capacitance-voltage curves before and after 900° C. post-gate anneal with Ru—Ta alloy, according to some embodiments of the present invention.

The potentially desirable properties of layers with at. % Ta between 40% and 54% may be attributed to the single $Ru_1Ta_1$ phase. Without wishing to be bound by any theory of operation, the electronic properties of this phase are believed to result in a low work function without compromising thermal stability. These layers in combination with Ru layers appear to be potential gate electrode candidates for NMOS and PMOS devices, respectively, according to some embodiments of the invention. Gate oxide leakage, as shown in FIG. 19, demonstrates the potential superiority of Ru—Ta alloy over the Ta layers. Constant current reliability is shown in FIG. 20 for Ru and Ru—Ta alloy with about 47 at. % Ta. High charge-to-breakdown is observed for both layers. Reliability for Ta-rich layers could not be measured in these embodiments due to their high oxide leakage. Ru—Ta alloys on PVD $ZrO_2$ annealed at 900° C. also exhibited excellent thermal stability with minimal change in EOT and VFB (FIG. 21).

The above Examples illustrate how binary metallic alloys of Ru—Ta according to some embodiments of the invention were studied for gate electrode applications. Alloys of $Ru_xTa_y$ with Ta concentrations between about 40% and about 54% according to some embodiments of the invention exhibited excellent properties as NMOS gate electrodes while alloys with Ta concentrations of less than about 20% according to some embodiments of the invention exhibited excellent properties as PMOS gate electrodes. In other embodiments, alloys of $Ru_xTa_y$ with Ta concentrations of more than about 30% invention exhibited potentially desirable properties as NMOS gate electrodes while alloys with Ta concentrations of less than about 30% according to some embodiments of the invention exhibited potentially desirable properties as PMOS gate electrodes. It appears that the $Ru_1Ta_1$ phase of the layer and formation of Ru—Ta bonds improves the thermal stability of the gate-dielectric interface while maintaining appropriate work functions.

Finally, it will be understood that although many of the above-described embodiments and Examples have referred to gate electrode applications, many embodiments of the invention also may be used for other integrated circuit electrode applications such as one or both electrodes of a capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   spaced apart source and drain regions in an integrated circuit substrate;
   a first gate insulating region on the integrated circuit substrate between the spaced apart source and drain regions;
   a first gate electrode on the first gate insulating region opposite the integrated circuit substrate, wherein the first gate electrode comprises an alloy comprising a first metal and a second metal having lower work function than the first metal;
   a second gate insulating region on the integrated circuit substrate between the spaced apart source and drain regions; and
   a second gate electrode on the second gate insulating region opposite the integrated circuit substrate, wherein the second gate electrode comprises an alloy comprising the first metal and the second metal having lower work function than the first metal to provide a multiple gate integrated circuit field effect transistor.

2. An integrated circuit according to claim 1 wherein the first metal has a work function of greater than about 4.5 eV and wherein the second metal has a work function of less than about 4.5 eV.

3. An integrated circuit according to claim 1 wherein the first metal has a work function of about 5 eV and wherein the second metal has a work function of about 4 eV.

4. An integrated circuit according to claim 1 wherein the first metal has a work function of between about 5 eV and about 5.2 eV and wherein the second metal has a work function of between about 4 eV and about 4.1 eV.

5. An integrated circuit according to claim 1 wherein the first metal has a work function of between about 5 eV and about 5.2 eV and wherein the second metal has a work function of between about 3.5 eV and about 4.0 eV.

6. An integrated circuit according to claim 1 wherein the second metal also has higher oxygen affinity than the first metal.

7. An integrated circuit according to claim 1 wherein the first metal is Ru and the second metal is Ta.

8. An integrated circuit comprising:
   first spaced apart source and drain regions in an integrated circuit substrate;
   a first gate insulating region on the integrated circuit substrate between the first spaced apart source and drain regions;
   a first gate electrode on the first gate insulating region opposite the integrated circuit substrate, wherein the first gate electrode comprises an alloy comprising Ru and Ta;
   second spaced apart source and drain regions in the integrated circuit substrate and of opposite conductivity type than the first spaced apart source and drain regions;
   a second gate insulating region on the integrated circuit substrate between the second spaced apart source and drain regions; and
   a second gate electrode on the second gate insulating region opposite the integrated circuit substrate, wherein the second gate electrode comprises an alloy comprising Ru and Ta and having different amounts of Ru relative to Ta than the first gate electrode.

9. An integrated circuit according to claim 8 wherein the first spaced apart source and drain regions are n-type spaced apart source and drain regions and wherein the second spaced apart source and drain regions are p-type spaced apart source and drain regions.

10. An integrated circuit according to claim 8 wherein the first spaced apart source and drain regions are n-type spaced apart source and drain regions, wherein the second spaced apart source and drain regions are p-type spaced apart source and drain regions and wherein the second gate electrode comprises a higher percentage of Ru relative to Ta than the first gate electrode.

11. An integrated circuit comprising:
   n-type spaced apart source and drain regions in an integrated circuit substrate;
   a first gate insulating region on the integrated circuit substrate between the n-type spaced apart source and drain regions;
   a first gate electrode on the first gate insulating region opposite the integrated circuit substrate;
   p-type spaced apart source and drain regions in the integrated circuit substrate;
   a second gate insulating region on the integrated circuit substrate between the p-type spaced apart source and drain regions; and
   a second gate electrode on the second gate insulating region opposite the integrated circuit substrate,
   wherein the first gate electrode comprises an Ru—Ta alloy having between about 40% Ta and about 54% Ta and wherein the second gate electrode comprises an Ru—Ta alloy having less than about 20% Ta.

12. An integrated circuit comprising:
   n-type spaced apart source and drain regions in an integrated circuit substrate;
   a first gate insulating region on the integrated circuit substrate between the n-type spaced apart source and drain regions;
   a first gate electrode on the first gate insulating region opposite the integrated circuit substrate;
   p-type spaced apart source and drain regions in the integrated circuit substrate;
   a second gate insulating region on the integrated circuit substrate between the p-type spaced apart source and drain regions; and
   a second gate electrode on the second gate insulating region opposite the integrated circuit substrate,
   wherein the first gate electrode comprises an Ru—Ta alloy having at least about 30% Ta and wherein the second gate electrode comprises an Ru—Ta alloy having less than about 30% Ta.

* * * * *